United States Patent [19]

Goto et al.

[11] Patent Number: 4,997,377
[45] Date of Patent: Mar. 5, 1991

[54] ADAPTOR FOR COMPUTERS

[75] Inventors: Kazuhiro Goto; Robert C. Kostash, both of Markham; Reid G. McBain, Agincourt, all of Canada

[73] Assignee: AMP Incorporated, Harrisburg, Pa.

[21] Appl. No.: 483,483

[22] Filed: Feb. 22, 1990

[51] Int. Cl.⁵ ............................................. H01R 9/09
[52] U.S. Cl. ...................................... 439/68; 439/67; 439/77; 439/493; 439/640
[58] Field of Search ...................... 439/67, 68, 76, 77, 439/492, 493, 577, 638, 640

[56]     References Cited
        U.S. PATENT DOCUMENTS

| | | | | |
|---|---|---|---|---|
| 4,655,524 | 4/1987 | Etzel | .............................. | 339/59 M |
| 4,657,324 | 4/1987 | Kamono et al. | ...................... | 439/68 |
| 4,716,500 | 12/1987 | Payne | .................................. | 439/67 |
| 4,808,112 | 2/1989 | Wood et al. | ......................... | 439/67 |
| 4,917,613 | 4/1990 | Kabadi | ................................. | 439/67 |

OTHER PUBLICATIONS

Abstract from Derent publication of U.S. application Ser. No. 196,048 filed 5/19/88.

Primary Examiner—Paula A. Bradley
Attorney, Agent, or Firm—Allan B. Osborne

[57]     ABSTRACT

An adaptor (14) for adding electronic components to a computer has been disclosed. The adaptor (14) includes a flexible printed circuit strip (34) having holes (38) in a first end section (36) for receiving a PGA package (16) and conductive pads (66) at a second end section (46) arranged in a predetermined pattern and conductive traces connected to and extending between the holes (38) and pads (66). The adaptor further includes a preform (80) having castellations (84) on each edge. The second end section (46) is wrapped around the preform (80) so that the conductive pads (66) are in registration with the castellations (84).

4 Claims, 5 Drawing Sheets

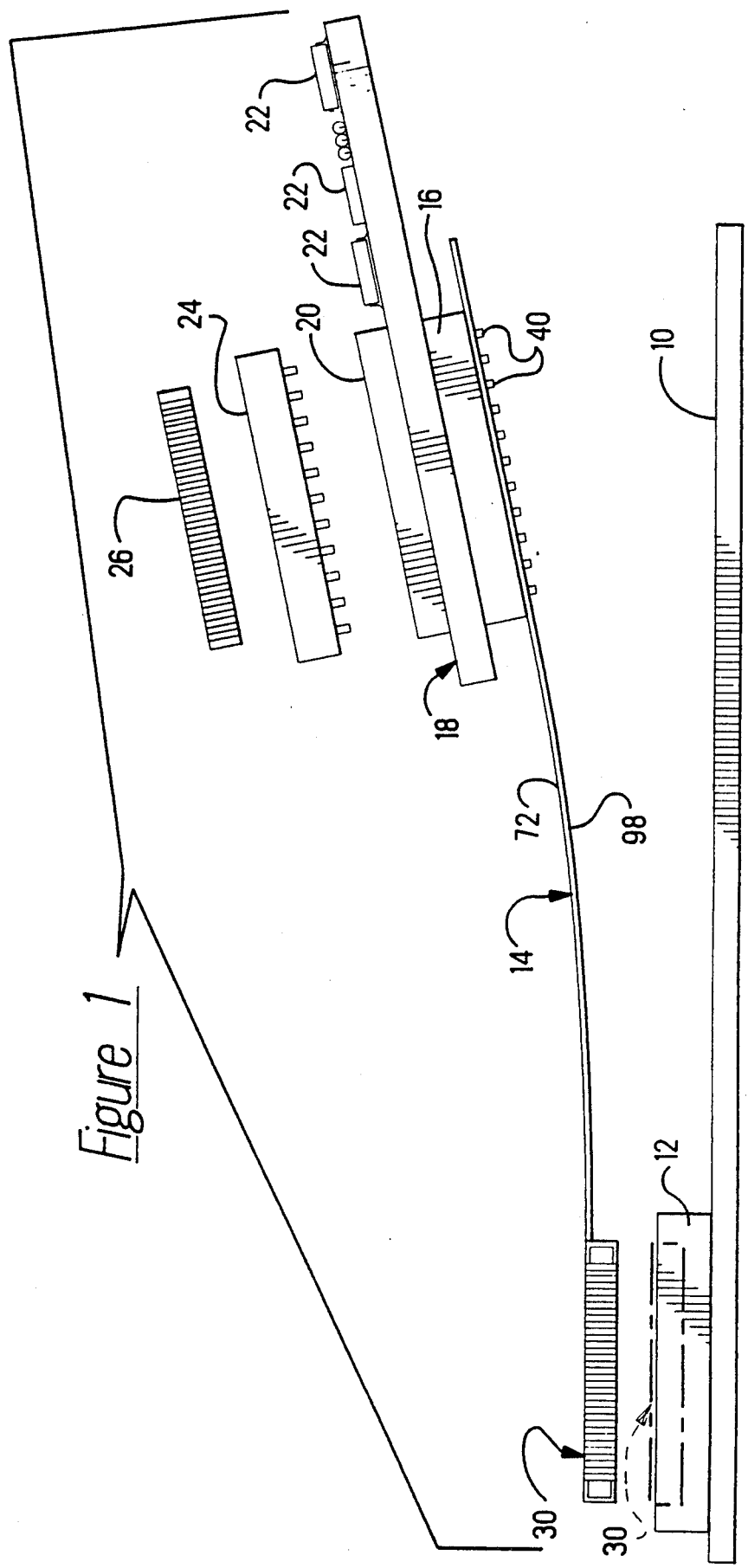

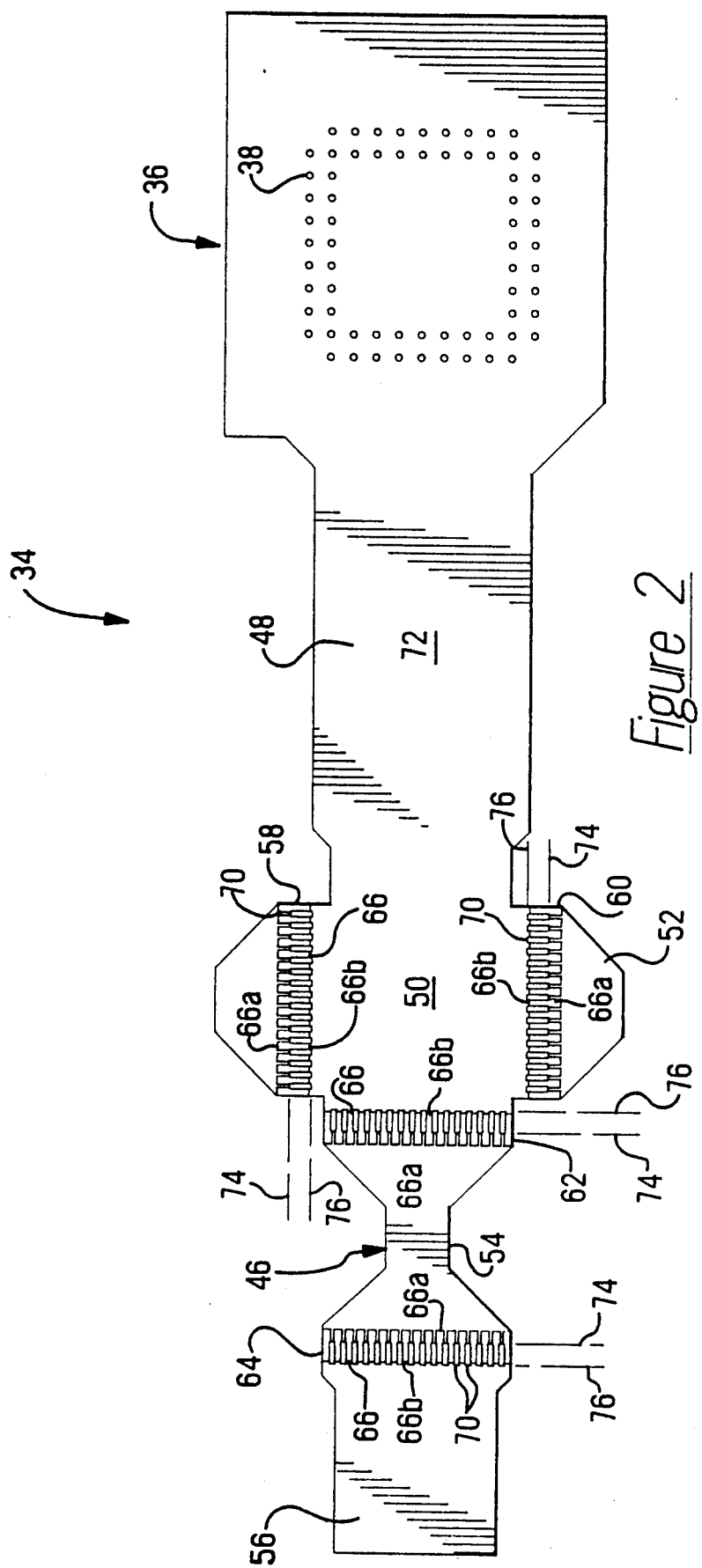

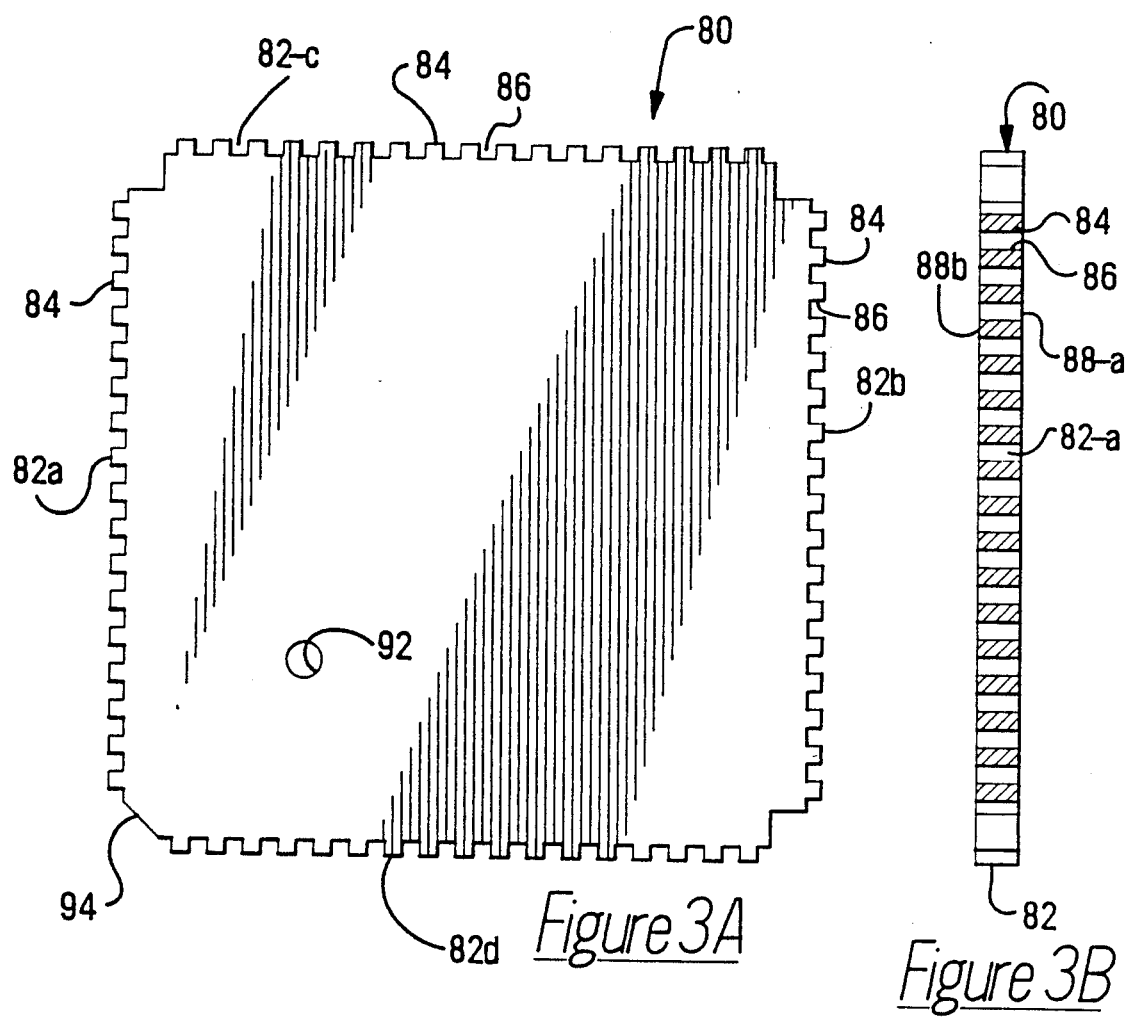
*Figure 3A*
*Figure 3B*
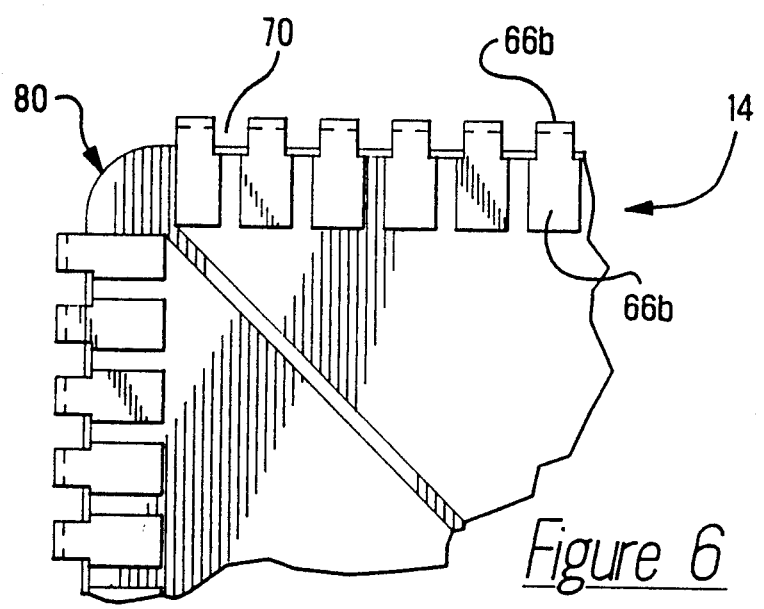
*Figure 6*

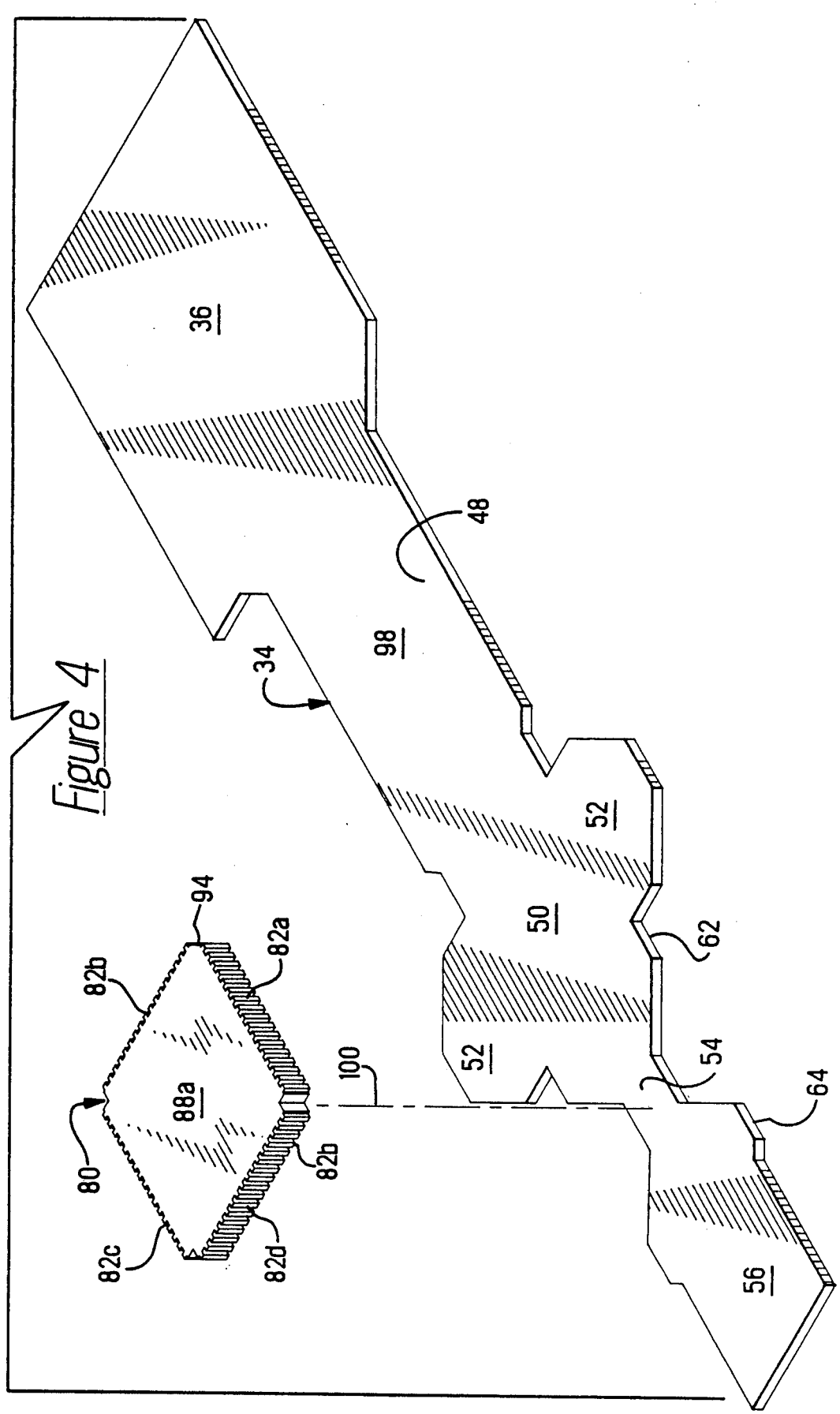

ADAPTOR FOR COMPUTERS

FIELD OF THE INVENTION

The invention disclosed herein relates to an adaptor for adding electronic components to a computer by using flexible circuitry and an existing socket on the mother board in the computer without any loss in the computer functionality.

BACKGROUND OF THE INVENTION

Users of computers and more particularly the desktop and personal computers often time have need to add enhancements thereto. One method of adding an enhancement, usually a circuit board populated with electronic components, is to connect said circuit board to the computer through the microprocessor's chip carrier socket on the computer motherboard. The current method of adding the enhancement board is by use of an adaptor manufactured and sold by Tektronix Inc. wherein one end of a flexible circuitry is adapted to plug into a low height chip carrier (LHCC) socket on the motherboard and the other end is adapted to connect to the enhancement board via a pin grid array (PGA). The enhancement board is equipped with its own LHCC socket to accept the microprocessor which is displaced from the motherboard's LHCC in favor of the adaptor flex circuit. However, this known adaptor is not usable with computers employing plastic leaded chip carrier (PLCC) sockets. It is therefore desirable to produce a universal adaptor suitable for use with both LHCC and PLCC sockets.

SUMMARY OF THE INVENTION

According to the invention, an adaptor for adding electronic components to a computer or other electronic devices is provided The adaptor includes a chip carrier-shaped preform having castellations on each edge. Further, the adaptor includes a flexible printed circuit strip with a first end section adapted to receive an electronic component or component-receiving socket and a second end section adapted to be wrapped around the preform with conductive pads on the strip in registration with castellations so that when the second end section is placed into a socket on a printed circuit board in a computer, the conductive pads are in electrical engagement with the contact elements therein. The strip further includes conductive traces extending between and electrically interconnecting the two end sections.

BRIEF DESCRIPTION OF THE DRAWINGS

FIG. 1 is a diagrammatic view of the typical application in which an adaptor, constructed in accordance with the present invention, is used;

FIG. 2 is a bottom plan view of a flexible printed circuit strip which is one component of the adaptor;

FIGS. 3A and 3B are bottom plan and side views respectively of a preform which is another component of the adaptor;

FIG. 4 is a perspective view of the circuit strip and preform prior to assembly;

FIG. 6 is an enlarged segment of a portion of the assembled adaptor.

DESCRIPTION OF THE INVENTION

Figure 5:
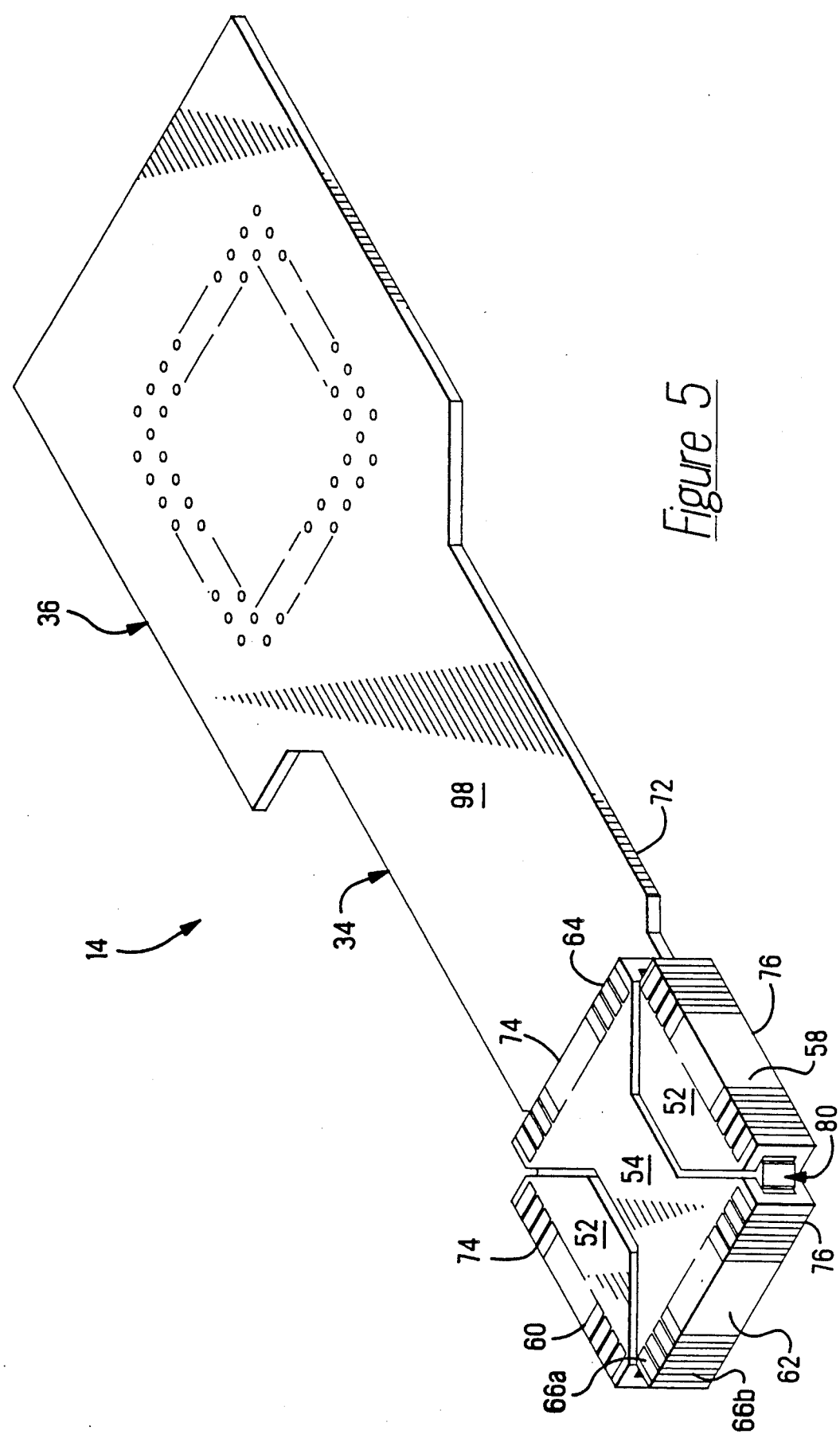
FIG. 5 is a perspective view of the assembled adaptor.

FIG. 1 is a diagrammatic view showing mother board 10 used in a computer (not shown); e.g., a personal computer such as made and sold by the IBM Corporation. Also shown are: socket 12 which may be a plastic leaded chip carrier (PLCC) socket or a low height chip carrier (LHCC) socket, both of which are made and sold by AMP Incorporated of Harrisburg, Pa.; an adaptor 14 of the present invention; a pin grid array (PGA) package 16 such as made and sold by AMP Incorporated; a computer card 18 made and sold under the trademark "ALL CHARGECARD II" by All Computers Inc. of Toronto, Canada; a second PGA package 20; various electronic components 22 mounted on card 18; a second PLCC or LHCC socket 24; and a chip carrier 26; e.g., a microprocessor such as made and sold by the Intel Company.

The computer (not shown) originally employed chip carrier 26, a micro-processor, in socket 12 on the mother board 10. One way of increasing the power of the computer is by adding memory without reducing the original capability. This can be accomplished by electrically connecting computer card 18 to board 10 through adaptor 14 of the present invention. Chip carrier 26 is removed from socket 12, end 30 of adaptor 14 plugged thereinto and chip carrier 26 is plugged into socket 24. Thus, the computer can now access electronic components 20,22 on card 18 as well as carrier 26. Adaptor 14 is electrically connected to computer card 18 via PGA package 16.

Adaptor 14 includes flexible printed circuit strip 34 shown in FIG. 2. As is well known, circuit strips such as strip 34 are made from an insulating film (not shown) such as produced by the DuPont Company under the trademark "KAPTON" and which contains conductive traces (not shown) on one or both sides.

With respect to strip 34, first end section 36 is provided with holes 38 arranged in a pattern to receive therethrough pins 40 (FIG. 1) on PGA package 16 which are then soldered to the conductive traces (not shown).

Extending between first end section 36 and second end section 46 is intermediate section 48, the length of which is determined by a given application.

Second end section 46 includes portion 50, flaps 52 extending laterally from portion 50, hourglass-shaped web 54, end tab 56 and four narrow, elongated contact areas 58,60,62 and 64. Contact areas 58,60 are located between portion 50 and respective flaps 52. Contact area 62 is located between portion 50 and web 54 and contact area 64 is located between web 54 and end tab 56.

Conductive pads 66, which are the terminus of the conductive traces (not shown) running from holes 38 in first end section 36, are provided along each contact area 58-64 as shown. Pads 66 on areas 58,60 are oriented normal to the axis of strip 34 while pads 66 on areas 62,64 are parallel thereto.

Holes 70 are punched through strip 34 between adjacent pads 66 on each contact area 58,64 as shown more clearly in FIG. 6B.

Pads 66 are exposed only on first surface 72 of strip 34.

Also shown in FIG. 2 are fold lines 74,76 which extend longitudinally across each contact area 58,64, line 74 being intermediate the ends of respective conductive pads 66 and line 76 being along one edge thereof. Further fold lines 74 divide conductive pads 66 into surface pads 66a and edge pads 66b.

FIGS. 3A and 3B illustrate preform 80, the second component of adaptor 14. Preform 80 is shaped to reflex the shape of chip carrier 26 but sized down therefrom by about double the thickness of strip 34. On sides 82a, 82b, 82c and 82d, castellations 84 are provided with slots 86 therebetween. As is apparent to workers in the industry, castellations 84 reflex the positioning and number of conductive contacts (not shown) on a plastic leaded chip carrier 26 and of the conductive surface pads (not shown) on a low height chip carrier 26. Hole 92 in preform 80 is provided for registration with strip 34 if required.

Beveled corner 94 is provided for registration with socket 12 (FIG. 1).

Preferably preform 80 is molded from a plastics material such as polyethersulfone.

FIG. 4 illustrates the first step in one of several methods for forming adaptor 14. Strip 34 is orientated with second surface 98 up and preform 80 ready to be positioned on web 54 as indicated by dashed line 100. After placing preform 80 on web 54, tab 56 is wrapped over the upwardly facing surface 88a with contact area 64 being folded along fold lines 74,76 so that edge pads 66b are against castellations 84 on side 82d and surface pads 66a are on downwardly facing preform surface 88b.

Preform 80, along with web 54 and tab 56 bearing against surfaces 88b and 88a respectively, is turned over onto portion 50.

Surface 88b and web 54 are now facing upwardly and tab 56 is between portion 50 and preform surface 88a. In the turning process, contact area 62 is folded along fold lines 74,76 to place pads 66b against castellations 84 on side 82b and pads 66a on surface 88b.

Flaps 52 are then folded in onto preform surface 88b so that pads 66b on contact areas 58,60 are positioned against respective castellations 84 on sides 82a,c respectively and pads 66a are positioned on preform surface 88b.

FIG. 5 shows the completed assembly of adaptor end 30. The mounting of PGA package 16 is preferably done subsequent to forming end 30.

FIG. 6 is an enlarged segment of adaptor 14 showing how holes 70, between adjacent pads 66b, enable circuit strip 34 to lie conformably on preform 80.

A suitable adhesive, such as an acrylic pressure sensitive, double-sided tape such as manufactured by the 3M Company, is used to secure the engaging surfaces of strip 34 to preform 80.

As can be discerned, an adaptor for adding electronic components to a computer has been disclosed. The adaptor includes a flexible printed circuit strip having conductive pads at one end which are configured to electrically engage contact elements in either a plastic leaded chip carrier socket or a low height chip carrier socket, one of which is found on a printed circuit board in the computer. Another end of the circuit strip includes holes for mounting a pin grid array package to which a computer card is electrically connected. Conductive traces on the circuit strip extend between the conductive pads and the holes at the other end.

We claim:

1. An adaptor for adding electronic components to a computer or other electronic device, comprising:
   a chip carrier-shaped preform having castellations on each edge; and
   an elongated flexible printed circuit strip having receiving means at a first end for electrically receiving an electronic component, conductive pads at a second end arranged in a predetermined pattern and conductive traces connected to and extending between said conductive pads and said receiving means, further, said second end includes a portion having the dimensions of one surface of said preform, flaps extending outwardly from opposing lateral edges of said portion and an hourglass-shaped web extending from an edge of said preform normal to the axis of said strip, said flaps and said hourglass-shaped web cooperating to cover one surface of said preform, said second end being folded around said preform with said conductive pads being in registration with respective castellations.

2. The adaptor according to claim 1 wherein said conductive pads on said second end are located between said portion and respective said flaps and at each end of said hourglass-shaped web.

3. The adaptor according to claim 1 further including a tab attached to a free end of said hourglass-shaped web, said tab being positioned between said portion and said preform.

4. The adaptor according to claim 1 wherein said second end is secured to said preform by an adhesive.

* * * * *